United States Patent
Suh et al.

(10) Patent No.: US 8,634,130 B2
(45) Date of Patent: Jan. 21, 2014

(54) 3-DIMENSIONAL STANDING TYPE METAMATERIAL STRUCTURE AND METHOD OF FABRICATING THE SAME

(75) Inventors: Hwan-soo Suh, Gunpo-si (KR); Chan-wook Baik, Yongin-si (KR); Hyung-bin Son, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 433 days.

(21) Appl. No.: 13/101,309

(22) Filed: May 5, 2011

(65) Prior Publication Data

US 2012/0113502 A1 May 10, 2012

(30) Foreign Application Priority Data

Nov. 8, 2010 (KR) .......................... 10-2010-0110342

(51) Int. Cl.
*G02B 1/00* (2006.01)
*H01Q 15/00* (2006.01)

(52) U.S. Cl.
CPC ............ *G02B 1/002* (2013.01); *G02F 2202/30* (2013.01); *H01Q 15/0086* (2013.01); *Y10S 977/834* (2013.01)
USPC ......................................... 359/346; 977/834

(58) Field of Classification Search
CPC . G02B 1/002; H01Q 15/0086; G02F 2202/30
USPC ...................... 359/333, 346; 977/834; 372/92
See application file for complete search history.

(56) References Cited

U.S. PATENT DOCUMENTS

| | | | |
|---|---|---|---|
| 6,938,325 B2 | 9/2005 | Tanielian | |
| 7,580,604 B2* | 8/2009 | D'Aguanno et al. | 385/129 |
| 7,826,504 B2* | 11/2010 | Chen et al. | 372/43.01 |
| 2003/0058908 A1* | 3/2003 | Griffel | 372/43 |
| 2007/0014006 A1* | 1/2007 | Tanaka et al. | 359/487 |

(Continued)

FOREIGN PATENT DOCUMENTS

| | | |
|---|---|---|
| KR | 10-2007-0050051 A | 5/2007 |
| WO | 2009/104872 A2 | 8/2009 |

OTHER PUBLICATIONS

Gansel et al. Gold Helix Photonic Metamaterial as Broadband Circular Polarizer. Science Sep. 18, 2009: 325 (5947), 1513-1515. Published online Aug. 20, 2009 [DOI:10.1126/science.1177031].*

(Continued)

*Primary Examiner* — Mark Hellner
*Assistant Examiner* — Ari M Diacou
(74) *Attorney, Agent, or Firm* — Sughrue Mion, PLLC

(57) ABSTRACT

Provided are 3-dimensional standing type metamaterial structures and methods of fabricating the same. The 3-dimensional metamaterial structure includes a substrate; and a resonator, which includes a fixing unit fixed to the substrate; and a plurality of arms, which extend from the fixing unit and are curved upward on the substrate, wherein permittivity, permeability, and refractive index of the metamaterial structure in a predetermined frequency band differ from permittivity, permeability, and refractive index of the substrate. The resonator may be easily fabricated in MEMS/NEMS (micro-electro-mechanical system/nano-electro-mechanical system) processes.

23 Claims, 7 Drawing Sheets

(56) References Cited

U.S. PATENT DOCUMENTS

| | | | | |
|---|---|---|---|---|
| 2007/0109023 | A1* | 5/2007 | Beausoliel et al. | 326/93 |
| 2007/0188385 | A1 | 8/2007 | Hyde et al. | |
| 2007/0237478 | A1* | 10/2007 | D'Aguanno et al. | 385/129 |
| 2008/0024792 | A1* | 1/2008 | Pendry et al. | 356/602 |
| 2009/0140946 | A1* | 6/2009 | Ziolkowski et al. | 343/788 |
| 2011/0063716 | A1* | 3/2011 | Yamada | 359/298 |
| 2011/0175795 | A1* | 7/2011 | Toujo | 343/909 |
| 2013/0210148 | A1* | 8/2013 | Gracias et al. | 435/396 |

OTHER PUBLICATIONS

K. Fan, A. Strikwerda, H. Tao, X. Zhang, and R. Averitt, "Stand-up magnetic metamaterials at terahertz frequencies," Opt. Express 19, 12619-12627 (2011). http://dx.doi.org/10.1364/OE.19.012619.*

C. Chen, C. Hsiao, S. Sun, K. Yang, P. Wu, W. Chen, Y. Tang, Y. Chau, E. Plum, G. Guo, N. Zheludev, and D. Tsai, "Fabrication of three dimensional split ring resonators by stress-driven assembly method," Opt. Express 20, 9415-9420 (2012). http://dx.doi.org/10.1364/OE.20.009415.*

* cited by examiner

3-DIMENSIONAL STANDING TYPE METAMATERIAL STRUCTURE AND METHOD OF FABRICATING THE SAME

CROSS-REFERENCE TO RELATED APPLICATIONS

This application claims priority from Korean Patent Application No. 10-2010-0110342, filed on Nov. 8, 2010, in the Korean Intellectual Property Office, the disclosure of which is incorporated herein in its entirety by reference.

BACKGROUND

1. Field

The present disclosure relates to artificial metamaterial structures with adjusted electromagnetic properties, and more particularly, to three-dimensional (3D) standing type metamaterial structures and methods of fabricating the same.

2. Description of the Related Art

Recently, research has been conducted into metamaterials, which have electromagnetic properties that may be adjusted using new methods. Since certain optical properties of such metamaterials, such as scattering parameters, refractive indices, permittivities, and permeabilities, may be freely adjusted, metamaterials are referred to as new materials or new structures. A new left hand law may be applied to metamaterials in place of the previously-known right hand law of electromagnetic waves, and, notably, light may be modulated by using the electric variability of metamaterials. Due to such properties, active research is being conducted into metamaterials in fields including radio frequency (RF), micrometer waves, terahertz (THz) waves, and infrared ray and visible ray fields. Particularly, metamaterials are seen as highly valuable to applications in fields including biophysics, medicine, spectroscopy, imaging, and security. In the case of split-ring resonators (SRRs), the properties of which have been subject to comprehensive research, their excellent resonance properties make them relatively easy to electrically and magnetically control, and research is being conducted into controlling the transmission properties of SSRs.

SUMMARY

The following description relates to 3-dimensional standing type metamaterials that may be fabricated in MEMS/NEMS (micro-electro-mechanical system/nano-electro-mechanical system) processes and methods of fabricating the same.

Additional exemplary aspects will be set forth in part in the description which follows and, in part, will be apparent from the description, or may be learned by practice of the presented embodiments.

According to an aspect of an exemplary embodiment, a metamaterial structure includes a substrate; and a resonator, which includes a fixing unit fixed to the substrate; and a plurality of arms, which extend from the fixing unit and are curved upward from the substrate, wherein the fixing unit and the plurality of arms include at least one conductive layer, and a permittivity, permeability, and refractive index of the metamaterial structure differ from a permittivity, permeability, and refractive index of the substrate, within a predetermined frequency band.

The plurality of arms may include a first arm and a second arm, together forming a split ring. The split ring may be arranged parallel to a plane that is substantially perpendicular to the substrate.

The plurality of arms may include a first arm and a second arm, together forming a first split ring, and a third arm and a fourth arm, together forming a second split ring. The first and second split rings may be substantially perpendicular to the substrate and the first and second split rings may intersect each other. Furthermore, the second split ring may be perpendicular to the first split ring.

The resonator may include a plurality of split rings, which are each arranged substantially perpendicular to the substrate and cross each other.

The resonator may further include a dielectric layer, which is disposed on a surface of the conductive layer. The dielectric layer may have a lattice constant different from that of the conductive layer. Furthermore, the dielectric layer may have a thermal expansion coefficient different from that of the conductive layer.

The conductive layer may include a plurality of different conductive layers formed of different materials. For example, the conductive layer may include a first conductive layer of a first metal, and a second conductive layer of a second metal, different from the first metal. The conductive layer may curve due to stresses between different materials of the different layers.

Curvatures of the plurality of arms may change due to at least one of an electric field, a magnetic field, an electromagnetic field, a current, a voltage, a temperature change, humidity, absorption of a chemical, desorption of a chemical, concentration of a chemical, a mechanical vibration, and a fluid pressure.

The plurality of arms may be flexible.

The substrate and the resonator may be flexible.

The resonators may be arranged on the substrate in a regular pattern.

According to an aspect of another exemplary embodiment, a method of fabricating a metamaterial structure includes providing a substrate; forming a fixing unit fixed to the substrate, forming a conductive layer on the substrate, patterning the conductive layer into a plurality of arms which extend from the fixing unit; and curving the plurality of arms upward from the substrate.

The method further includes forming a combining unit on the substrate in a first region and forming a sacrificing layer on the substrate in a second region different from the first region. Forming the fixing unit, forming the conductive layer, and patterning the conductive layer includes forming the conductive layer on the combining unit and the sacrificing layer; etching the conductive layer into a pattern including the fixing unit and the plurality of arms extending from the fixing unit; and removing the sacrificing layer.

The curving the plurality of arms may include curving the plurality of arms using mechanical force.

The method may further include forming a dielectric layer above or below the conductive layer, and the patterning may further include patterning the dielectric layer with the conductive layer.

The curving the plurality of arms may include causing the plurality of arms to curve due to a difference between a lattice constant of one layer and a lattice constant of another layer, a difference between a thermal expansion coefficient of one layer and a thermal expansion coefficient of another layer, a difference between a tensile stress of one layer and a tensile stress of another layer, or a difference between a compressive stress of one layer and a compressive stress of another layer.

The forming the conductive layer may include forming at least one first conductive layer comprising a first material and forming at least one second conductive layer comprising a second material, different from the first material, and the patterning may include patterning the at least one first layer and the at least one second layer. Here, the curving the plurality of arms may include causing the plurality of arms to curve due to stresses between different conductive layers.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1:
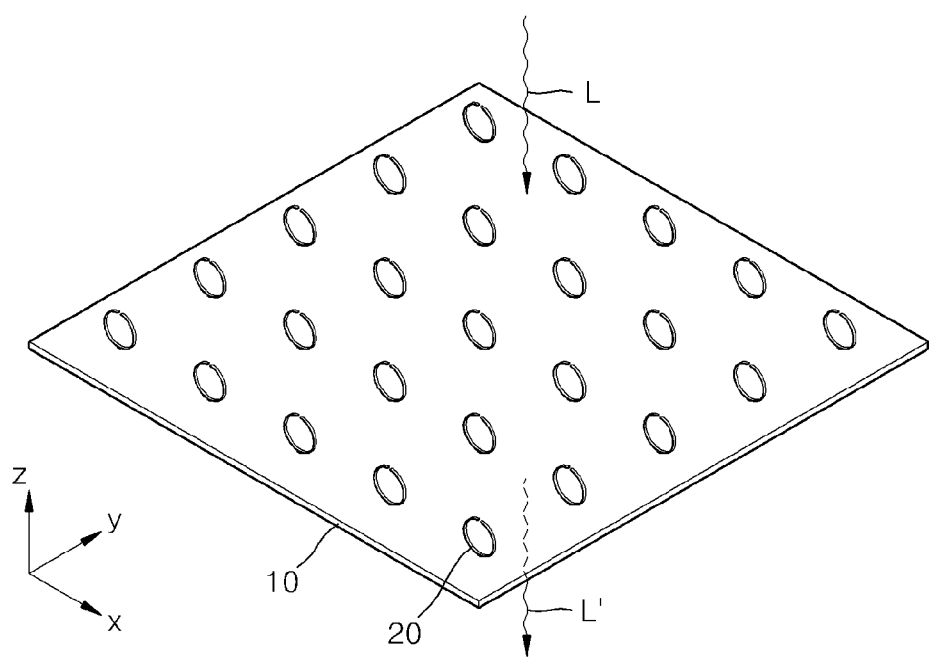
FIG. 1 is a schematic perspective view of a metamaterial structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In descriptions given below, metamaterials refer to artificial structures having electromagnetic properties that may not be readily found in ordinary materials present in nature. The characteristics of a metamaterial are due to its structural element or elements, such as a resonator, rather than its material composition, and thus, a metamaterial may be referred to as a metamaterial structure.

Figure 2:
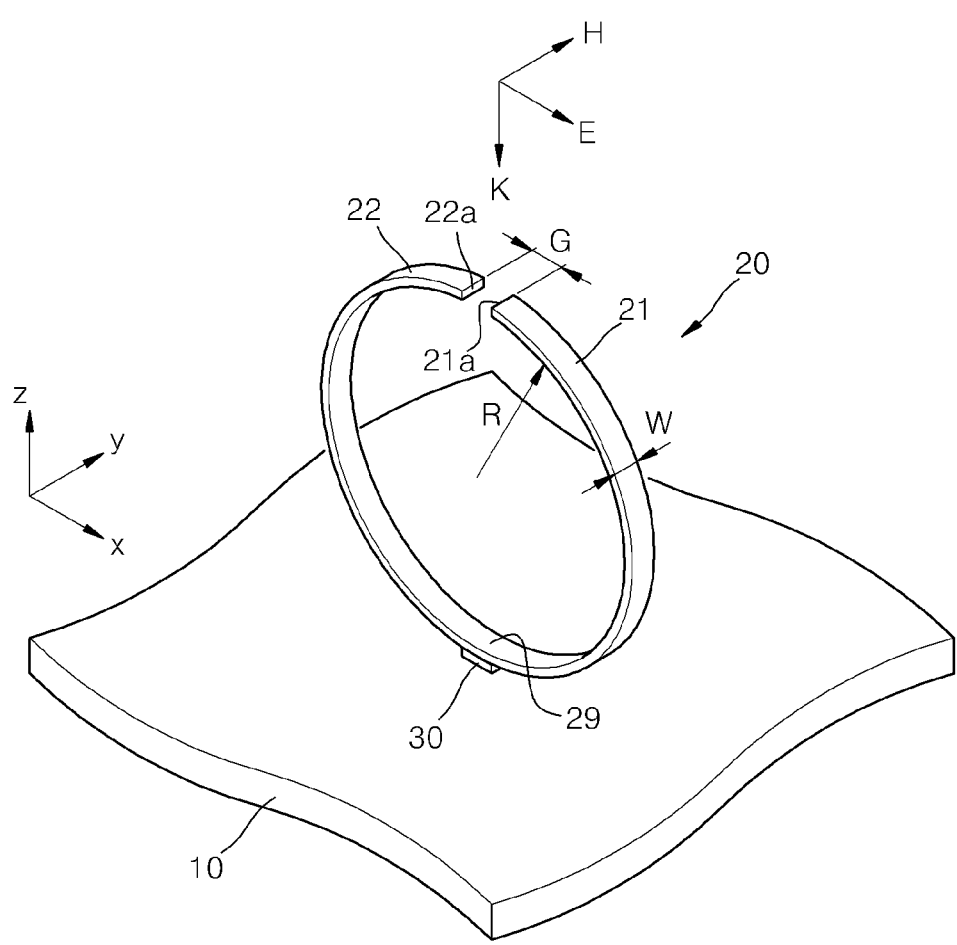
FIG. 2 is a diagram showing a resonator constituting the metamaterial structure according to an embodiment.

FIG. 1 is a schematic perspective view of a metamaterial structure according to an embodiment, and FIG. 2 is a diagram showing a resonator 20 of the metamaterial structure.

Referring to FIGS. 1 and 2, the metamaterial structure includes a substrate 10 and the resonator 20.

The substrate 10 may be a single-layer substrate containing a single dielectric or a multi-layer substrate containing different dielectrics. Dielectrics may include insulating materials and semiconductor materials. The substrate 10 may be formed of a hard material or a flexible material. If the substrate 10 is formed of a flexible material, the resonator 20 may also have flexibility as described below, and thus, the metamaterial structure may have flexibility. The substrate 10 may be formed of a material that is transparent with respect to a predetermined wavelength of an electromagnetic wave or may have a sufficiently small thickness for an electromagnetic wave to be transmitted therethrough. A predetermined electrode pattern (not shown) may be formed on the substrate 10 to provide power to the resonator 20 or to detect changes in electric properties (e.g., a capacitance) of the resonator 20.

The resonator 20 includes a fixing unit 29 and a pair of arms 21 and 22, which extend from the fixing unit 29 and are curved upward from the substrate 10. A combining unit 30 is formed between the substrate 10 and the fixing unit 29, so that the resonator 20 is fixed to the substrate 10 by the combining unit 30. The combining unit 30 may be formed of an insulative material or a conductive material. For purposes of providing power to the resonator 20 or detecting changes in electric properties of the resonator 20, at least a portion of the combining unit 30 may be formed of a conductive material to electrically connect an electrode pattern formed on the substrate 10 and the resonator 20 to each other.

The pair of arms 21 and 22 and the fixing unit 29, which constitute the resonator 20, may be integrated as a single body. The resonator 20 may be a single layer structure including one conductive layer or may be a multi-layer structure including conductive layers. The resonator 20 may be formed of a flexible material. For example, a conductive layer may be a metal such as gold, silver, or copper or may be a conductive non-metal such as graphene. If the resonator 20 has a multi-layer structure, the structure may include at least one dielectric layer formed above or below a conductive layer or may include at least two different stacked conductive material layers. The pair of arms 21 and 22 is curved upward. For example, if the resonator 20 is formed of a single conductive layer, the pair of arms 21 and 22 may be curved upward by mechanical manipulation or by using a difference between tensile/compressive stresses of the inner portion and the outer portion of the conductive layer. Alternatively, if a conductive layer of the resonator 20 is formed of two layers of different conductive materials (e.g., two different metals), the arms 21 and 22 may curve on their own due to stresses between the heterogeneous materials. Alternatively, the resonator 20 may be formed of a dielectric layer (201 of FIG. 3B) and a conductive layer (202 of FIG. 3B) having different lattice constants or thermal expansion coefficients. In this case, the arms 21 and 22 may curve on their own due to the different lattice constants or thermal expansion coefficients of the dielectric layer 201 and the conductive layer 202, and thus, the split-ring structure may be formed. Alternatively, if the dielectric layer 201 is formed of a material having an expansion coefficient which changes according to humidity, such as polyimide, or a material having an expansion coefficient which changes according to absorption/desorption of a chemical or according to a concentration of a chemical, such as an alkanethiol self-assembled monolayer (SAMS) on a surface of gold, the arms 21 and 22 may curve on their own, and thus, the split-ring structure may be formed. Alternatively, the dielectric layer 201 may be formed of a piezoelectric material known in the art, and thus, the arms 21 and 22 may curve on their own due to deformation based on a piezoelectric effect.

The resonator 20, which is formed of the pair of arms 21 and 22 and the fixing unit 29, may have a split ring structure and may be a 3D standing type structure. In detail, a split ring may be formed of arms 21 and 22 which are the same length and which extend and curve in opposite directions from the fixing unit 29. The pair of arms 21 and 22 is arranged on a virtual plane substantially perpendicular to the substrate 10 (the x-z plane in FIG. 1), and the gap between ends 21a and 22a of the arms 21 and 22 is disposed in a portion of the ring structure away from the substrate 10 in the z-direction. The arms 21 and 22 may have the same curvature in the lengthwise direction, such that the arms 21 and 22 form a circular split ring having a radius of curvature R.

If the resonator 20 has the arrangement structure shown in FIG. 2, when an electromagnetic wave L is incident on the metamaterial structure, the magnetic resonance intensity of the resonator 20 is dependent on the magnitude of the magnetic field component of the magnetic field H of the electromagnetic wave L in a direction perpendicular to the resonator 20, that is, the magnetic field component in the y-direction as shown in FIG. 2. Therefore, when the electromagnetic wave L is incident in the z-direction and the magnetic field H is in the y-direction, which is a direction perpendicular to the resonator 20, the magnetic resonance may reach a maximum. Furthermore, if the electric field E of the electromagnetic wave L is in the x-direction, which is a direction parallel to the resonator 20, electrical resonance may also occur in the resonator 20. Electromagnetic properties of the metamaterial structure are closely related to the resonance properties of the resonator 20, and the shape and the size of the resonator 20 may be designed such that the metamaterial structure has a negative permittivity, a negative permeability, or a negative refractive index in a predetermined frequency band. In other words, as the resonator 20 resonates an incident electromagnetic wave, the permittivity, permeability, and refractive index of the metamaterial structure may differ from the permittivity, permeability, and refractive index of the substrate 10 in a predetermined frequency band, and thus, the metamaterial structure may have metamaterial properties.

A plurality of the resonators 20 may be arranged. Further, the plurality of resonators 20 may be regularly arranged, as shown in FIG. 1. Furthermore, all of the plurality of resonators 20 may have a same resonance property. For example, each of the plurality of resonators 20 may have the same radius R, width W, and gap width G (see FIG. 2), and the arms 21 and 22 of each of the resonators 20 may be arranged parallel to each other.

If desired, the plurality of resonators 20 may be arranged in a particular pattern. Furthermore, the plurality of resonators 20 may have different resonance properties. For example, the arms 21 and 22 of each of the plurality of resonators 20 may be arranged in different directions, so that the resonance properties of some of the plurality of resonators 20 may be less dependent on a polarization direction as compared to the case in which the arms 21 and 22 of all of the plurality of resonators 20 are arranged in the same direction. Furthermore, some of the plurality of resonators 20 may have different radiuses R, different widths W, and/or different gap widths G. Dimensions of the resonator 20, including the radius R, width W, and gap width G, are closely related to the wavelength of an effected electromagnetic wave. Generally, in the case of a split ring resonator, metamaterial properties are exhibited due to an electric and magnetic interaction of an electromagnetic wave having a wavelength from about ten times to dozens of times longer than a dimension of the split ring resonator. Therefore, if some of the plurality of resonators 20 have different dimensions that other resonators 20, the metamaterial structure as a whole can exhibit metamaterial properties for electromagnetic waves within a broad wavelength band. In other words, the metamaterial structure may exhibit broadband properties.

Although the arms 21 and 22 of the resonator 20 have been described as having the same length from the fixing unit 29 in the present embodiment, they are not so limited. For example, one of the arms 21 and 22 may be shorter than that the other one of the arms 21 and 22. In this case, the formed between the ends of the arms is biased toward one side of the split ring, and thus, the resonator 20 may have different resonance properties. For example, if one of the arms 21 and 22 is three times longer than the other one of the arms 21 and 22 and the arms 21 and 22 are curved with the same radius of curvature R, the gap that is formed will be biased in the x-direction with respect to the center of the split ring.

Curvatures of the arms 21 and 22 may be changed according to an external factor, and thus, the transmission, reflection, and absorption properties of the metamaterial structure may dynamically change. Examples of external factors which may change the curvatures are an electric field, a magnetic field, an electromagnetic field, a current, a voltage, a temperature change, humidity, absorption/desorption of a chemical, concentration of a chemical, mechanical vibration, and fluid pressure, among other.

For example, if an electric field is applied to the resonator 20, charges may be induced in a conductive layer of the resonator 20, and thus, the curvatures of the arms 21 and 22 may change due to electrostatic force. If a magnetic field is applied to the resonator 20, curvatures of the arms 21 and 22 may change due to the magnetostatic force due to a magnetization or magnetic polarization of the resonator 20. If the resonator 20 includes heterogeneous layers (e.g. both a conductive layer and a dielectric layer, or two heterogeneous conductive layers), which have different thermal expansion coefficients, the transmission, reflection, and absorption properties of the metamaterial structure may be dynamically changed according to variations in the exterior temperature, electromagnetic heating, Joule heating or the like. If the resonator 20 includes a piezoelectric material layer, the transmission, reflection, and absorption properties of the metamaterial structure may be actively adjusted by controlling curvatures of the arms 21 and 22 by applying a voltage to the resonator 20. If the resonator 20 includes a material layer which expands or contracts due to moisture, the transmission, reflection, and absorption properties of the metamaterial structure may be dynamically changed according to the humidity. If the resonator 20 includes a material layer which expands or contracts due to the absorption/desorption of a chemical or due to the concentration of a chemical, the transmission, reflection, and absorption properties of the metamaterial structure may be dynamically changed according to the absorption/desorption of the chemical or the concentration of the chemical. If the resonator 20 is formed of a flexible material, the transmission, reflection, and absorption properties of the metamaterial structure may be dynamically changed according to the pressure, velocity, or the like of a fluid flowing in a space in which the metamaterial structure is located.

Since the transmission, reflection, and absorption properties of a metamaterial structure may be controlled by dynamically controlling various factors as stated above, a metamaterial structure may also be used as a modulator, a switch, a phase shifter, a filter, or the like for radio waves, microwaves, terahertz waves, infrared rays, visible rays, or the like.

Furthermore, since the transmission, reflection, and absorption properties of a metamaterial structure are variable based on factors such as those stated above, a metamaterial structure may be used as a sensor for detecting changes of in one or more of the factors stated above, by detecting the modulation of an output electromagnetic wave L' with respect to an input electromagnetic wave L or by detecting changes of in the electric properties (e.g., capacitance) of the resonator 20. In other words, a metamaterial structure may be employed in an infrared (IR) ray or ultraviolet (UV) ray optical sensor system, a detector for chemical/biological materials, or the like due to the dynamic properties of the metamaterial structure.

FIGS. 3A through 3E are schematic diagrams showing a method of fabricating the metamaterial structure such as that shown in FIG. 1.

Figure 3A:
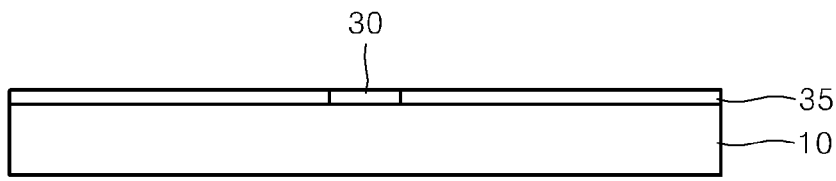
FIGS. 3A through 3E are schematic diagrams showing a method of fabricating the metamaterial structure shown in FIG. 1.

Referring to FIG. 3A, the combining unit 30 is formed on a region of the substrate 10, and a sacrificing layer 35 is formed on the substrate 10 in a region other than the region in which the combining unit 30 is formed. The combining unit 30 and the sacrificing layer 35 are formed in the same layer and are formed of materials with different etching selectivities.

Figure 3B:
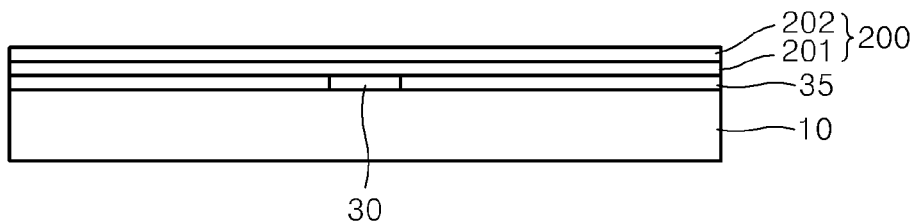

Referring to FIG. 3B, a resonator layer 200 is formed on the layer including the combining unit 30 and the sacrificing layer 35. For example, the resonator layer 200 may be formed by sequentially stacking a dielectric layer 201 and a conductive layer 202. The conductive layer 202 is formed of a material with sufficient electric conductivity to generate resonance in a wavelength band of a predetermined electromagnetic wave L. For example, the conductive layer 202 may be a thin layer of metal, such as gold, silver, or copper, or a layer of a non-metal material such as graphene. The dielectric layer 201 contains a predetermined dielectric with a lattice constant different from that of the conductive layer 202. If the dielectric layer 201 is located below the conductive layer 202 as shown in FIG. 3B, the conductive layer 202 is formed of a material with a lattice constant less than that of the dielectric layer 201.

Figure 3C:
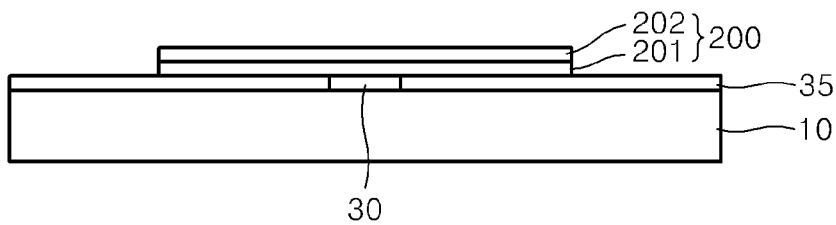
Figure 4:
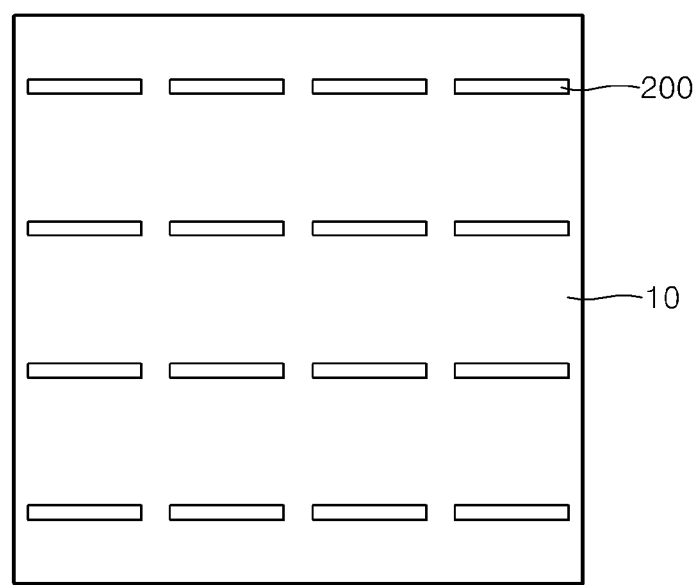
FIG. 4 is a diagram showing a resonator pattern in the operation shown in FIG. 3C.

Referring to FIG. 3C, the resonator layer 200 for each resonator is patterned into an strip-like shape as shown in FIG. 4. The patterning may be performed via a known photolithography process. The strip-like shape of the resonator layer 200 may be such that a portion (e.g., the center portion) of the strip shape of the resonator layer 200 is arranged at a location corresponding to the combining unit (30 of FIG. 3A).

Figure 3D:
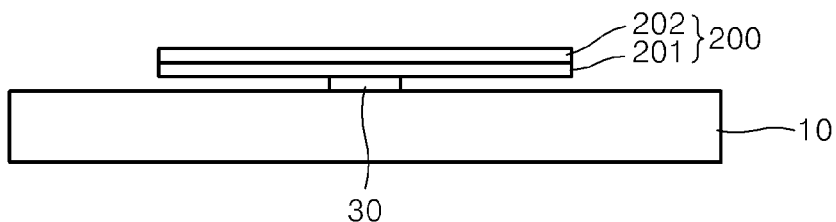

Referring to FIG. 3D, the sacrificing layer 35 is removed. The sacrificing layer 35 may be removed by performing a known wet etching process utilizing the different etching selectivities of the combining unit 30 and the sacrificing layer 35.

Figure 3E:
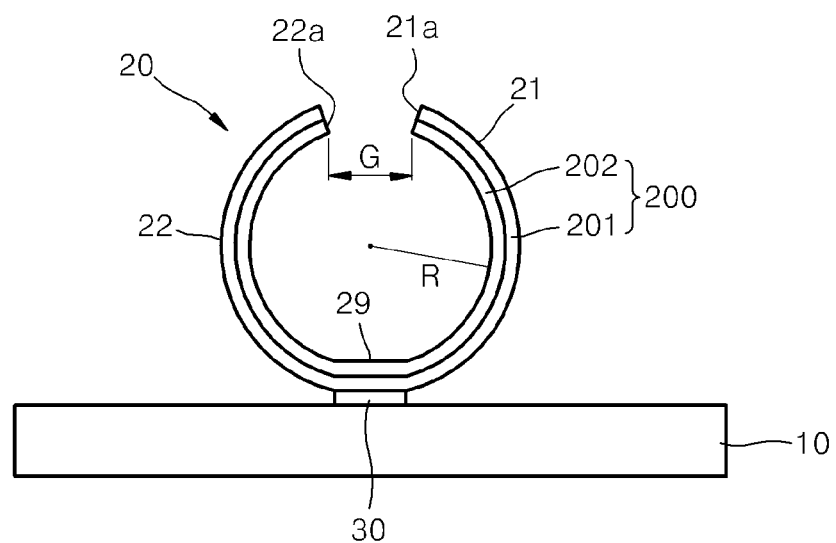

Next, referring to FIG. 3E, the resonator layer 200 is bent. The resonator layer 200 may bend/curve itself. As described above, if the conductive layer 202 is formed of a material with a lattice constant less than that of the dielectric layer 201, the conductive layer 202 receives tensile stress. Therefore, if the remaining portion of the resonator layer 200 that has been patterned into the strip-like shape, excluding the portion of the resonator layer which forms the fixing unit 29 attached to the combining unit 30, is released by removing the sacrificing layer 35, the conductive layer 202 is compressively deformed. As a result, the portions of the resonator layer 200 forming the arms curve upward on their own. The deformation occurs along the length of the strip-like shape in the lengthwise direction thereof, and thus, the resulting curve in the arms 21 and 22 has a constant radius of curvature R. The gap G between ends 21a and 22a of the arms 21 and 22 may be determined based on the lengths of the arms 21 and 22, a difference between the lattice constants inducing the deformation, etc.

If desired, the dielectric layer 201 may be located on the conductive layer 202. In this case, the dielectric layer 201 is formed of a material with a lattice constant less than that of the conductive layer 202.

The resonator layer 200 may be curved in various manners other than deformation due to a difference between lattice constants. For example, the dielectric layer 201 and the conductive layer 202 may be formed of materials with different thermal expansion coefficients, such that the dielectric layer 201 and the conductive layer 202 expand differently in room temperature. In this case, the resonator layer 200 may be curved upward by removing the sacrificing layer 35 and heating or cooling the resonator layer 200. The dielectric layer 201 or the conductive layer 202 may be formed of a material with piezoelectric properties. In this case, the resonator layer 200 may be curved due to a piezoelectric deformation induced by applying a voltage to the conductive layer 202. The resonator layer 200 may curve on it's own due to tensile stress differences or compressive stress differences between the dielectric layer 201 and the conductive layer 202.

Although the dielectric layer 201 has been described as a single layer, the dielectric layer 201 may be a plurality of layers, and the resonator layer 200 may curve on its own due to tensile stress differences or compressive stress differences between the dielectric layers.

Furthermore, according to the way in which the resonator layer 200 is curved, the dielectric layer 201 may be omitted. For example, if the dielectric layer 201 is omitted and the conductive layer 202 is formed by stacking two or more different conductive material layers, the resonator layer 200 may curve on its own due to stresses between the different conductive materials. Furthermore, if the resonator layer 200 is formed of a single conductive layer 202 without a dielectric layer 201, the resonator layer 200 may be curved upward by using differences in tensile/compressive stresses between opposite surfaces of the conductive layer or by applying a mechanical force.

As described above, a 3D metamaterial structure may be fabricated using a semiconductor fabrication process in micro-electro-mechanical system (MEMS) and nano-electro-mechanical system (NEMS) fields.

To form a 3D structure using a direct etching process, a plurality of photolithography operations using a plurality of masks and a very thick electroplating operation are used. However, a 3D structure as described herein may be easily formed by forming a 2-dimensional pattern through a relatively small number of photolithography operations and causing the pattern to curve/bend into a third dimension.

Furthermore, a 3D structure may be fabricated in a low-temperature process with an appropriate material selection, and thus, the same process may be performed on a flexible substrate. Therefore, a 3D structure as described herein may be formed to have flexibility.

Figure 5:
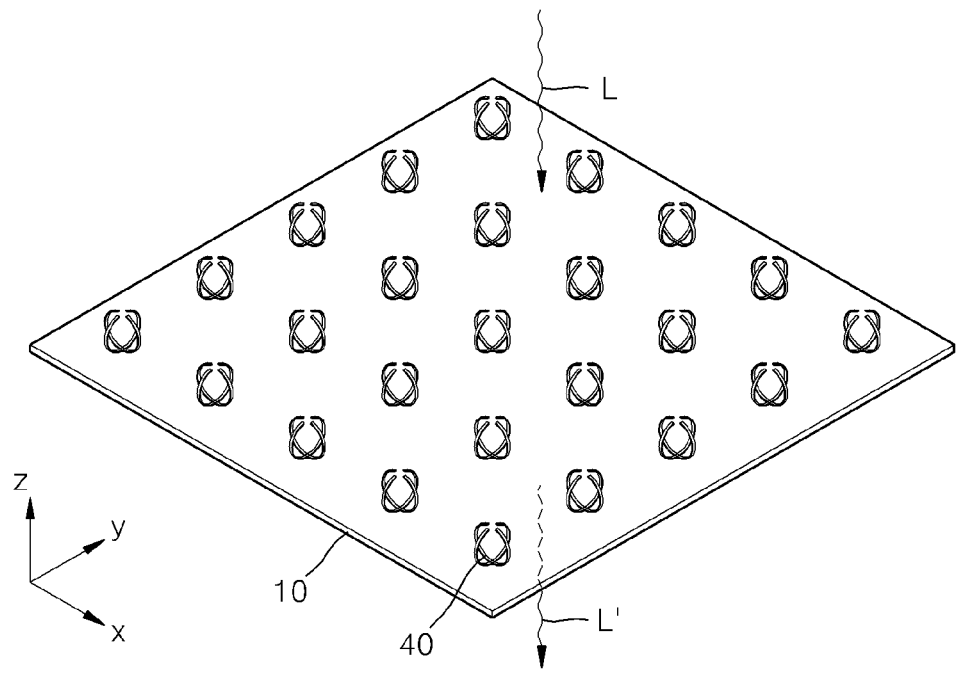
FIG. 5 is a schematic perspective view of a metamaterial structure according to another embodiment.
Figure 6:
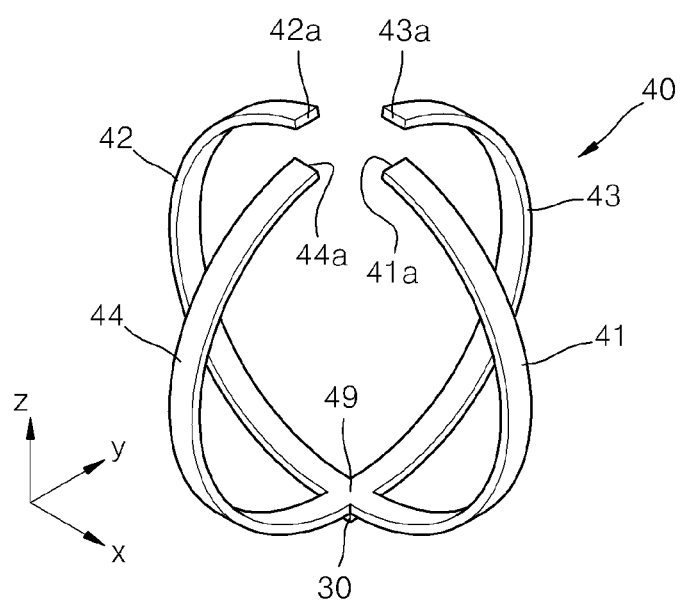
FIG. 6 is a diagram showing a resonator of the metamaterial structure of FIG. 5 in detail.

FIG. 5 is a schematic perspective view of a metamaterial structure according to another embodiment, and FIG. 6 is a diagram showing a resonator 40 of the metamaterial structure of FIG. 5 in detail.

Referring to FIGS. 5 and 6, the metamaterial structure includes the substrate 10 and one or more resonators 40. A resonator 40 includes a fixing unit 49 and four arms 41, 42, 43, and 44, which extend from the fixing unit 49 and are curved upward from the substrate 10. The four arms 41, 42, 43, and 44 are paired in twos and form two split rings as shown in FIG. 6. The two split rings share the fixing unit 49, and thus, a 3-dimensionally overlapping split ring resonator structure is formed. In other words, the gap between ends 41a and 42b of a first pair the arms 41 and 42 and the gap between ends 43a and 44b of a second pair of the arms 43 and 44 are disposed away from the substrate in the z-direction with respect to the center of the split rings. If the four arms 41, 42, 43, and 44 have the same length, the gaps will overlap with each other.

Figure 7:
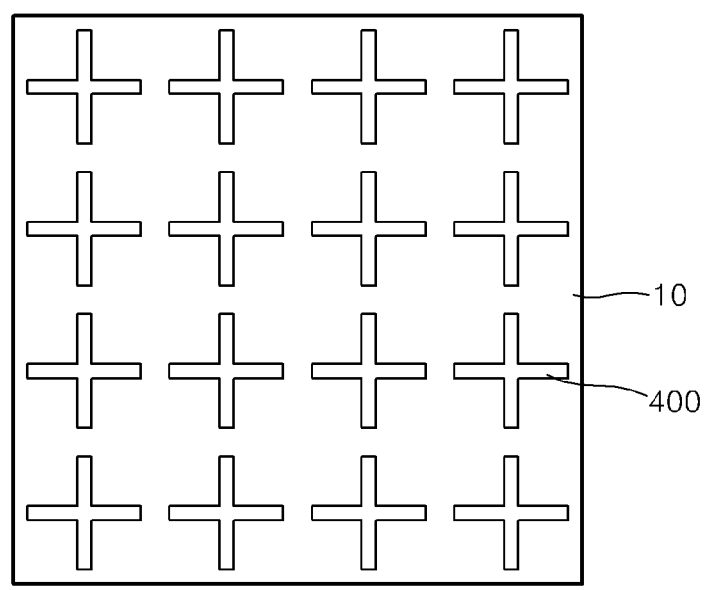
FIG. 7 is a diagram showing a resonator pattern during fabrication of the metamaterial structure shown in FIG. 5.

Furthermore, the split ring formed by the first pair of arms 41 and 42 is arranged in the x-z plane and the split ring formed by the second pair of arms 43 and 44 is arranged in the y-z plane, thus the split ring formed by the first pair of arms 41 and 42 and the split ring formed by the second pair of arms 43 and 44 may be substantially perpendicular to each other. As the two split rings are substantially perpendicular to each other, the resonance properties of an incident electromagnetic wave L may be relatively less dependent on a direction of the magnetic field H as compared to a single split-ring resonator. The resonator 40 having the two split rings perpendicular to each other may be easily formed by patterning a resonator layer into a cross-shaped pattern 400 as shown in FIG. 7 instead of the resonator pattern shown in FIG. 4. The substrate 10, the combining unit 30 for attaching the resonator 40 to the substrate 10, and the single layer structure or the multi-layer structure of the resonator 40 of the resonator 40 may be substantially identical to those of the resonator 20, described above, and thus, detailed descriptions thereof will be omitted.

Figure 8:
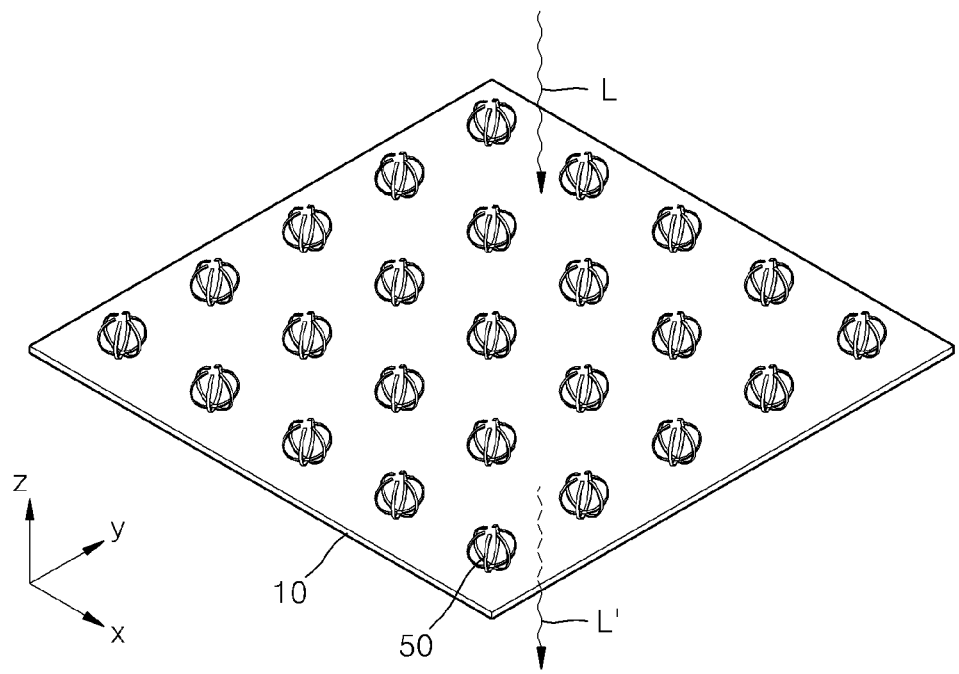
FIG. 8 is a schematic perspective view of a metamaterial structure according to another embodiment.
Figure 9:
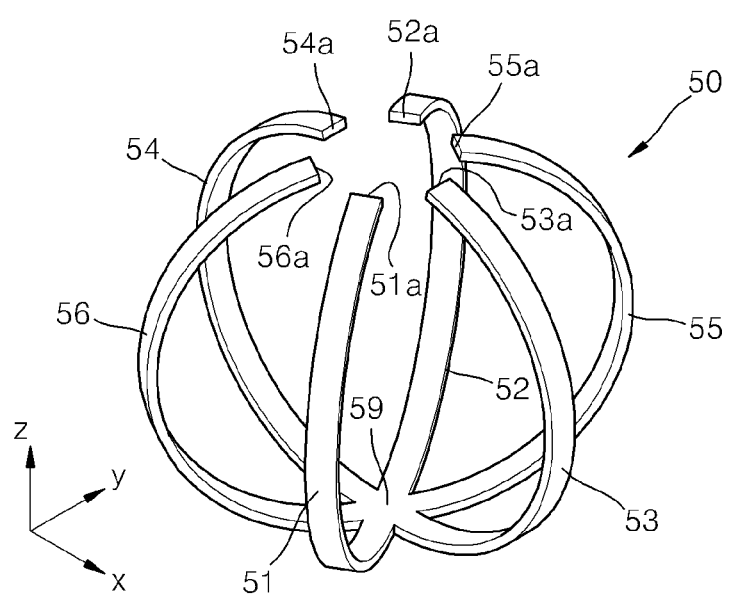
FIG. 9 is a diagram showing a resonator of the metamaterial structure of FIG. 8 in detail.

FIG. 8 is a schematic perspective view of a metamaterial structure according to another embodiment, and FIG. 9 is a diagram showing a resonator 50 of the metamaterial structure of FIG. 8 in detail.

Referring to FIGS. 8 and 9, the metamaterial structure includes the substrate 10 and the resonator 50. The resonator 50 includes a fixing unit 59 and six arms 51, 52, 53, 54, 55, and 56, which extend from the fixing unit 59 and are curved upward from the substrate 10. The six arms 51, 52, 53, 54, 55, and 56 are paired in twos and form three split rings as shown in FIG. 9. The three split rings share the fixing unit 59, and thus, a 3-dimensionally overlapping split ring resonator structure is formed. In other words, the split rings may be arranged on different virtual planes which are each substantially perpendicular to the substrate 10. Furthermore, the virtual planes in which the split rings are arranged may cross each other at equal angles. Because the three split rings cross each other, the resonance properties of an incident electromagnetic wave L may be less dependent on the direction of the magnetic field H of the incident electromagnetic wave L as compared to a single split-ring resonator. The resonator 50 having the three split rings may be easily formed by patterning a resonator layer to have a different resonator pattern as compared to the resonator pattern shown in FIG. 4. The substrate 10, the combining unit (not shown) for attaching the resonator 50 to the substrate 10, and the single layer structure or the multi-layer structure of the resonator 50 are substantially identical to those of the resonator 20, and thus, detailed descriptions thereof will be omitted.

Although the resonators 20, 40, and 50, as described above have two, four, and six arms, respectively, (the arms 21 and 22 in FIG. 1, the arms 41 through 44 in FIG. 5, and the arms 51 through 56 in FIG. 8), a larger number of arms may be formed. Furthermore, although the resonators 20, 40, and 50 have circular split ring resonator structures, the embodiments described herein are not limited thereto. A resonator may have a non-circular split ring structure, such as a rectangular split ring structure, achieved by curving only portions of arms constituting the resonator. Furthermore, although the resonators 20, 40, and 50 have circular split ring resonator structures with gaps, embodiments described herein are not limited thereto. Magnetic resonance may occur even if resonators have no gaps, and thus, arms of the resonators may curved upwards without a gap. Furthermore, a resonator may be formed to have any of various shapes by patterning a resonator layer to any of various resonator patterns (e.g. FIG. 4 or FIG. 7) during fabrication.

Metamaterial structures and methods of fabricating the same as described herein may have one or more effects as follows.

First, a metamaterial structure may be fabricated easily and inexpensively through a MEMS/NEMS processes.

Second, transmission, reflection, and absorption properties of a metamaterial structure may be dynamically adjusted by using various factors including an electric field, a magnetic field, an electromagnetic field, a current, a voltage, a temperature change, humidity, absorption/desorption of a chemical, concentration of a chemical, a mechanical vibration, a fluid pressure, and the like.

Third, a metamaterial structure may be employed in an IR or UV optical sensor system, a detector for chemical/biological materials, or the like for dynamic properties of a metamaterial structure.

Fourth, a metamaterial structure may be used in a super lens, sub-diffraction limit optics, a radio frequency (RF) circuit, an optical filter, a RF filter, and the like.

Fifth, a flexible metamaterial structure may be fabricated.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A metamaterial structure comprising:
    a substrate; and
    a resonator comprising:
        a fixing unit which is fixed to the substrate; and
        a plurality of arms, which extend from the fixing unit and are curved upward from the substrate,
    wherein each of the fixing unit and the plurality of arms comprises at least one conductive layer, and
    at least one of a permittivity, a permeability, and a refractive index of the metamaterial structure differ from a corresponding at least one of a permittivity, a permeability, and a refractive index of the substrate, within a predetermined frequency band.

2. The metamaterial structure of claim 1, wherein the plurality of arms comprises a first arm and a second arm, together forming a split ring.

3. The metamaterial structure of claim 2, wherein the split ring is substantially perpendicular to the substrate.

4. The metamaterial structure of claim 1, wherein the plurality of arms comprises a first arm and a second arm, together forming a first split ring, and a third arm and a fourth arm, together forming a second split ring.

5. The metamaterial structure of claim 4, wherein the first and the second split rings are each substantially perpendicular to the substrate and wherein the first split ring intersects the second split ring.

6. The metamaterial structure of claim 5, wherein the second split ring is perpendicular to the first split ring.

7. The metamaterial structure of claim 1, wherein the resonator comprises a plurality of split rings, each of which is substantially perpendicular to the substrate and wherein one of the plurality of split rings intersects with another of the plurality of split rings each other.

8. The metamaterial structure of claim 1, wherein each of the fixing unit and the plurality of arms further comprises a dielectric layer, which is disposed on a surface of the conductive layer.

9. The metamaterial structure of claim 8, wherein a lattice constant of the dielectric layer is different from a lattice constant of the conductive layer.

10. The metamaterial structure of claim 8, wherein a thermal expansion coefficient of the dielectric layer is different from a thermal expansion coefficient of the conductive layer.

11. The metamaterial structure of claim 1, wherein the at least one conductive layer comprises a first conductive layer comprising a first material and a second conductive layer comprising a second material, different from the first material.

12. The metamaterial structure of claim 1, wherein curvatures of each of the plurality of arms change according to at least one of an electric field, a magnetic field, an electromagnetic field, a current, a voltage, a temperature change, humidity, absorption of a chemical, desorption of a chemical, a concentration of a chemical, a mechanical vibration, and a fluid pressure.

13. The metamaterial structure of claim 1, wherein the plurality of arms are flexible.

14. The metamaterial structure of claim 1, wherein the substrate and the resonator are flexible.

15. The metamaterial structure of claim 1, wherein the resonator is a plurality of the resonators arranged on the substrate in a regular pattern.

16. A method of fabricating a metamaterial structure, the method comprising:
    providing a substrate;
    forming a fixing unit on the substrate, wherein the fixing unit is fixed to the substrate;
    forming a conductive layer on the substrate;
    patterning the conductive layer into a plurality of arms which extend from the fixing unit; and
    curving the plurality of arms upward from the substrate.

17. The method of claim 16, further comprising:
    forming a combining unit on the substrate in a first region; and
    forming a sacrificing layer on the substrate in a second region different from the first region;
    wherein the forming the fixing unit, forming the conductive layer, and patterning the conductive layer comprises:
        forming the conductive layer on the combining unit and the sacrificing layer
        etching the conductive layer into a pattern comprising the fixing unit and the plurality of arms extending from the fixing unit, wherein the fixing unit is formed in the first region, and
        removing the sacrificing layer.

18. The method of claim 16, wherein the curving the plurality of arms comprises curving the plurality of arms using a mechanical force.

19. The method of claim 16, further comprising forming a dielectric layer above or below the conductive layer;
    wherein the patterning the conductive layer further comprises patterning the dielectric layer with the conductive layer.

20. The method of claim 19, wherein the curving the plurality of arms comprises causing the plurality of arms to curve due to a difference between a lattice constant of the conductive layer and a lattice constant of the dielectric layer, a difference a thermal expansion coefficient of the conductive layer and a thermal expansion coefficient of the dielectric layer, a difference between a tensile stress of the conductive layer and a tensile stress of the dielectric layer, or a difference between a compressive stress of the conductive layer and a compressive stress of the dielectric layer.

21. The method of claim 16,
    wherein the forming the conductive layer comprises forming at least one first conductive layer comprising a first material and forming at least one second conductive layer comprising a second material, different from the first material, and
    wherein the patterning the conductive layer comprises patterning the at least one first conductive layer and the at least one second conductive layer.

22. The method of claim 21, wherein the curving the plurality of arms comprises causing the plurality of arms to curve due to stresses between the at least one first conductive layer and the at least one second conductive.

23. A metamaterial structure comprising:
    a substrate; and
    a split ring resonator comprising:
        a fixing unit portion which is fixed to the substrate; and
        at least one pair of arms comprising a first arm and a second arm which extend from the fixing unit portion and curve upward from the substrate, forming a split ring shape;
    wherein the fixing unit portion and the at least one pair of arms are a single unitary element comprising at least one conductive layer; and
    wherein at least one of a permittivity, permeability, and a refractive index of the metamaterial structure different from a corresponding at least one of a permittivity, a permeability, and a refractive index of the substrate within a predetermined frequency band.

* * * * *